United States Patent
Fukuda

[11] Patent Number: 6,127,870
[45] Date of Patent: Oct. 3, 2000

[54] OUTPUT DELAY CIRCUIT

[75] Inventor: Atsuo Fukuda, Hyogo, Japan

[73] Assignee: Matsushita Electric Works, Ltd., Osaka, Japan

[21] Appl. No.: 09/121,802

[22] Filed: Jul. 23, 1998

[30] Foreign Application Priority Data

Jul. 29, 1997 [JP] Japan ..................................... 9-203618

[51] Int. Cl.[7] ................................................. G01R 31/28
[52] U.S. Cl. ........................... 327/265; 327/273; 327/279
[58] Field of Search ................................... 327/265, 273, 327/279, 286, 263, 291, 299

[56] References Cited

U.S. PATENT DOCUMENTS

| | | | |
|---|---|---|---|
| 4,566,111 | 1/1986 | Tanagawa | 377/28 |
| 4,606,058 | 8/1986 | Kruger et al. | 377/39 |
| 5,638,017 | 6/1997 | Kim | 327/176 |
| 5,867,050 | 2/1999 | Matsuura | 327/294 |

FOREIGN PATENT DOCUMENTS

| | | |
|---|---|---|
| 2934890 C3 | 12/1980 | Germany . |
| 3302744 A1 | 8/1984 | Germany . |
| 4020652 A1 | 1/1990 | Germany . |
| 4026169 A1 | 4/1991 | Germany . |
| 53-13338 | 2/1978 | Japan ..................................... 327/279 |
| 60-249417 | 12/1985 | Japan ..................................... 327/279 |
| 61-156596 | 7/1986 | Japan . |
| 1-166155 | 6/1989 | Japan . |
| 4-69701 | 3/1992 | Japan . |

*Primary Examiner*—Tuan T. Lam
*Attorney, Agent, or Firm*—Fish & Richardson P.C.

[57] ABSTRACT

An output delay circuit has a counter which is reset at every input of an input signal of a first signal state thereto and counts input clocks while the input signal of a second signal state is inputted thereto; a comparator for comparing an accumulated number of the input clocks having been counted by the counter with a predetermined clock number set in advance; and a logic circuit for, when it is determined by the comparator that the accumulated number of the input clocks is less than the predetermined clock number, outputting an output signal having a signal state same as the first signal state of the input signal, while for, when it is determined by the comparator that the accumulated number of the input clocks is not less than the predetermined clock number, outputting an output signal having a signal state same as the second signal state of the input signal

9 Claims, 2 Drawing Sheets

OUTPUT DELAY CIRCUIT

1. Field of the Invention

The present invention relates to an output delay circuit which delays an input signal applied thereto with a predetermined time period and outputs the input signal thus delayed as an output signal.

2. Description of the Related Art

Conventionally, there have been proposed an output delay circuit shown in FIGS. 4 and 5 as an example of such an output delay circuit. This output delay circuit is a filter including a resistor R and a capacitor C, which, upon reception of a control signal I in FIG. 5 outputted from a microprocessor Mi for accessing a storage device Me, delays the control signal with a time delay and outputs II in FIG. 5.

As described above, the conventional output delay circuit delays the inputted control signal by a given delay time period and outputs the control signal thus delayed. Accordingly, when another control signal such as an address signal shown in FIG. 5 is inputted to the storage device simultaneously with the input of the control signal I in FIG. 5 to the output delay circuit, the predetermined control, (in this case, the addressing to the storage device by the address signal) is performed by the another control signal (address signal) during the given delay time period. Thus, upon the lapse of the given delay time period, the control signal II in FIG. 5 is applied to the storage device thereby to perform predetermined control.

However, the conventional output delay circuit has a problem that, since the delay time period is determined by the physical values of the resistor and capacitor, a desired delay time period can not always be obtained.

SUMMARY OF THE INVENTION

The present invention has been made in view of the aforesaid problem, and an object of the present invention is to provide an output delay circuit which can delay an input signal and output the input signal upon the lapse of a desired delay time period after the reception of the input signal.

According to the present invention, there is provided an output delay circuit comprising: clock counting means which is reset at every input of an input signal of a first signal state thereto and counts input clocks while the input signal of a second signal state is inputted thereto; comparing means for comparing an accumulated number of the input clocks having been counted by the clock counting means with a predetermined clock number set in advance; and outputting means for, when it is determined by the comparing means that the accumulated number of the input clocks is less than the predetermined clock number, outputting an output signal having a signal state same as the first signal state of the input signal, while for, when it is determined by the comparing means that the accumulated number of the input clocks is not less than the predetermined clock number, outputting an output signal having a signal state same as the second signal state of the input signal.

The input signal may be a control signal outputted from a microprocessor for controlling access operation to a storage device to which the output signal: is inputted.

Further, the above control signal may be one of a write signal for controlling writing operation to the storage device and a read signal for controlling reading operation from the storage device.

DETAILED DESCRIPTION OF THE PREFERRED EMBODIMENTS

Figure 1:
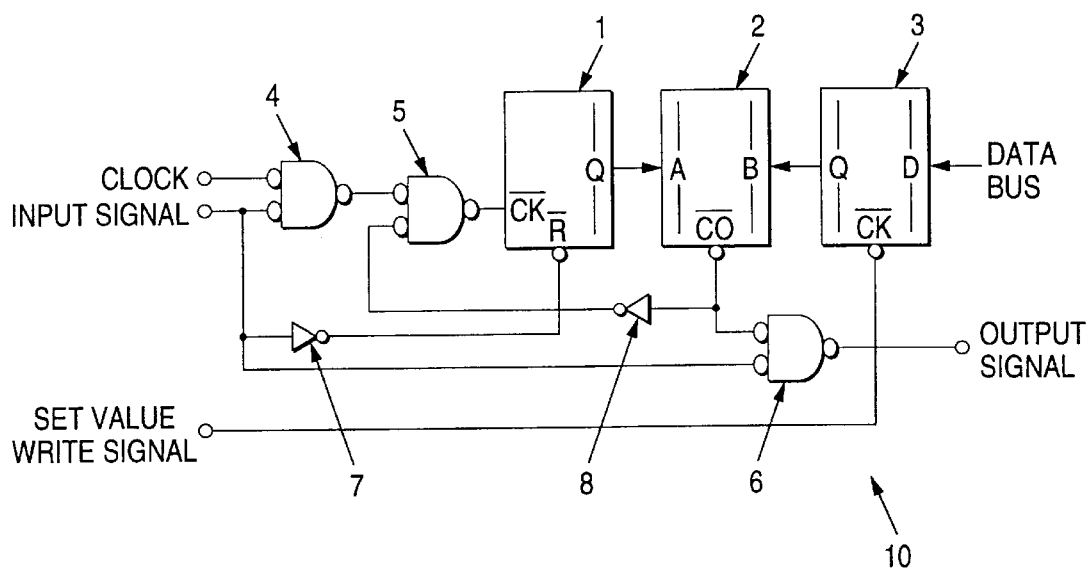
FIG. 1 is a diagram showing an arrangement of an output delay circuit according to an embodiment of the present invention.
Figure 2:
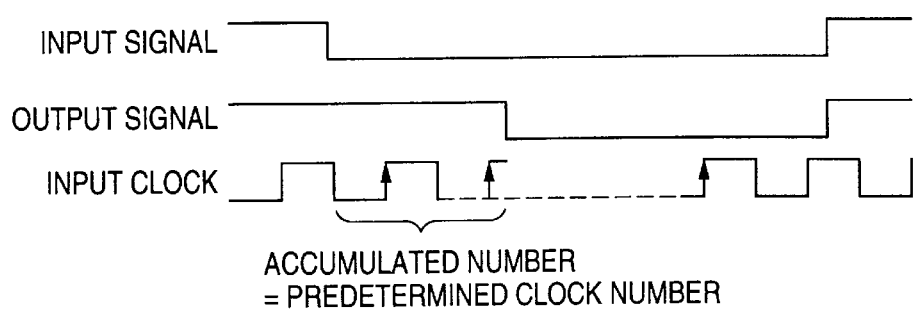
FIG. 2 is a timing chart showing the operation of the output delay circuit according to the embodiment.
Figure 3:
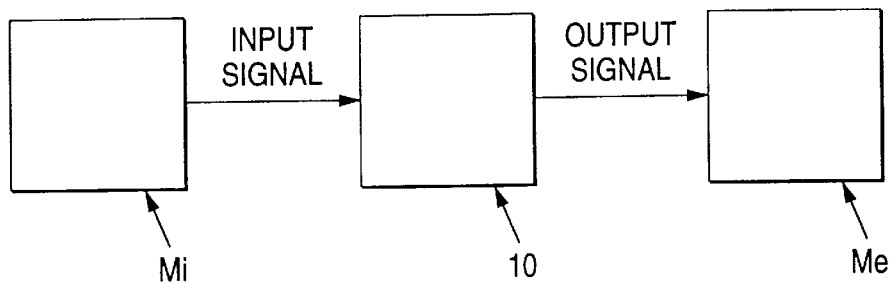
FIG. 3 is a diagram showing an entire arrangement wherein the output delay circuit according to the embodiment is connected between a microprocessor and a storage device.
Figure 4:
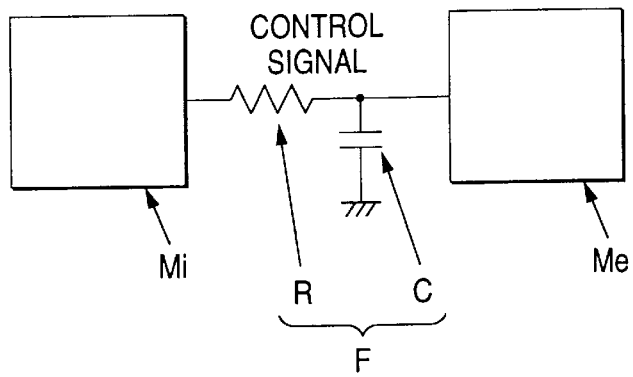
FIG. 4 is a diagram showing an arrangement of an example of conventional output delay circuits.
Figure 5:
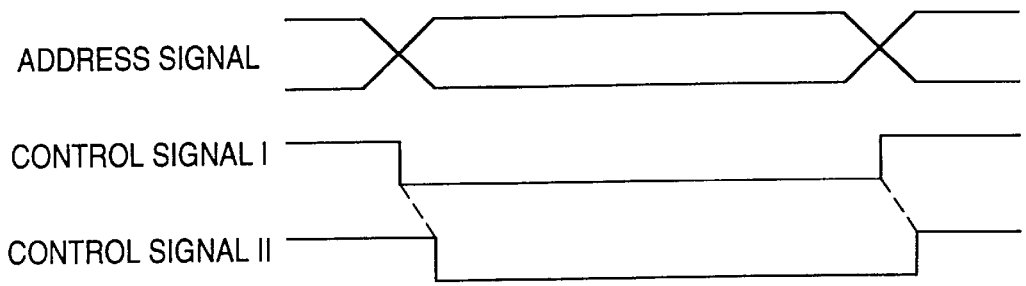
FIG. 5 is a timing chart of signals for explaining the operation of the circuit shown in FIG. 5.

An embodiment of the present invention will be described with reference to FIGS. 1 to 3. An output delay circuit 10 is a circuit which, when a write signal outputted from a microprocessor Mi for controlling-the writing operation of the storage device Me is inputted to the output delay circuit, can output the inputted signal upon the lapse of a predetermined delay time period as an output signal after the reception thereof. To this end, the output delay circuit is formed by a counter (clock counting means) 1, comparator (comparing means) 2, latch 3, first logic circuit 4, second logic circuit 5, third logic circuit (output portion) 6, first inverter 7 and second inverter 8.

The counter (clock counting means) 1 counts clocks inputted into a CK terminal thereof at every rising of the clock and outputs the count value or accumulated count value of the clocks to a Q terminal thereof. When an R signal inputted into an R terminal of the counter is at a low (L) level, the counter resets the accumulated count value and outputs a value "0" at the Q terminal thereof.

The comparator (comparing means) 2 compares an A side signal which is outputted from the Q terminal of the counter 1 and inputted into an A terminal thereof with a B side signal which is outputted from a Q terminal of the latch 3 and inputted into a B terminal of the comparator. When the A side signal coincides with the B side signal, the comparator outputs an "L" (low) level signal representing the coincidence at a coincidence output terminal CO thereof.

The latch 3 receives a set value write signal at a CK terminal thereof and further receives data inputted at a D terminal thereof through a data bus connected thereto, whereby the data is written into the latch and then outputted from the Q terminal thereof.

The first logic circuit 4 receives the clocks at one input terminal thereof and further receives an input signal to the output delay circuit 10 at the other terminal thereof, whereby the first logic circuit outputs an "H" (high) level signal from an output terminal thereof when at least one of the input values applied to the one and the other input terminals thereof is at an "H" level.

The second logic circuit 5 receives at one input terminal thereof the output value from the output terminal of the first logic circuit 4 and further receives at the other input terminal thereof an output value from the second inverter 8, whereby the second logic circuit outputs an "H" level signal from an output terminal thereof when at least one of the input values applied to the one and the other input terminals thereof is at an "H" level.

The third logic circuit (output portion) 6 receives at one input terminal thereof the output value from the coincidence output terminal CO of the comparator 2 and further receives at the other input terminal thereof the input signal to the output delay circuit 10, whereby the third logic circuit outputs an "H" level signal from an output terminal thereof when at least one of the input values applied to the one and the other input terminals thereof is at an "H" level.

The first inverter 7 receives the input signal to the output delay circuit 10 at an input terminal thereof, then inverts the signal state of the input signal and outputs the inverted input signal to the R terminal of the counter 1 from an output terminal thereof.

The second inverter 8 receives the output value from the coincidence output terminal CO of the comparator 2 at an input terminal thereof, then inverts the signal state of the output value and outputs the inverted output value to the other input terminal of the second logic circuit 5 from an output terminal thereof.

The operation of the output delay circuit will be explained. The explanation will be made as to the case where the data of the data bus, that is, a predetermined number of the clocks which is a data of the data bus is "0". When the data of the data bus is "0", a value "0" is inputted into the B terminal of the comparator 2 from the Q terminal of the latch 3. When the input signal inputted into the output delay circuit 10 is at an "H " level which is the first signal state representing a non-enable state, the input signal of the "H" level is inverted by the first inverter 7 and then applied to the R terminal of the counter 1 as an "L" level. Thus, the counter resets its count value having been accumulated and outputs a value "0" from the Q terminal thereof to the A terminal of the comparator 2.

In this case, since each of the A side signal and the B side signal applied to the comparator 2 is "0", the comparator outputs an "L" level signal representing the coincidence at the coincidence output terminal CO thereof. Thus, the "L" level signal from the coincidence output terminal CO is inverted by the second inverter 8 and applied to the other input terminal of the second logic circuit 5 as an "H" level. As a consequence, the output value from the output terminal of the second logic circuit 5, that is, the input value to the CK terminal of the counter 1 becomes an "H" level irrespective of the input values of "L" and "H" levels to the one input terminal of the second logic circuit 5, so that the counting operation of the counter 1 is stopped. At this time, the output signal of the output delay circuit 10 is an "H" level.

Under such a condition that the counting operation of the counter 1 is stopped, even when the input signal inputted into the output delay circuit 10 changes to an "L" level which is the second signal state representing an enable state, the output value from the coincidence output terminal CO of the comparator 2 does not change from "L" level. That is, the counter 1 has been resetting the accumulated count value, so that the counting operation is not performed. Therefore, even if "H" level signal is input into R terminal of the counter 1, it is not counted. Thus, the value of the "L" level is kept to be inputted into the one input terminal of the third logic circuit 6. Since the value of an "L" level representing the second signal state is also applied to the other input terminal of the third logic circuit 6, the third logic circuit 6 receives the value of the "L" level at both the input terminals thereof. Accordingly, the third logic circuit 6 outputs from its output terminal an output signal of an "L" level representing the same signal state as the input signal. In other words, the input signal is outputted as it is from the output terminal as the output signal without being delayed.

Next, the explanation will be made as to the case where the data of the data bus, that is, the predetermined number of the clocks is a natural number. When the data of the data bus is a natural number, the natural number is inputted into the B terminal of the comparator 2 from the Q terminal of the latch 3. When the input signal inputted into the output delay circuit 10 is at an "H" level which is the first signal state, the input signal of the "H" level is inverted by the first inverter 7 and then applied to the R terminal of the counter 1 as an "L" level. Thus, the counter resets its count value having been accumulated and outputs a value "0" from the Q terminal thereof to the A terminal of the comparator 2.

In this case, since the A side signal and the B side signal applied to the comparator 2 do not coincide, the comparator outputs an "H" level signal representing the non-coincidence at the coincidence output terminal CO thereof. In this case, since the first logic circuit 4 receives at the other input terminal thereof the input signal of an "H" level, the first logic circuit always outputs a value of an "H" level irrespective of the levels "H" and "L" of the clocks inputted into the one input terminal thereof. In other words, the first logic circuit stops outputting the input clocks and so the input clock is not hereafter applied to the CK terminal of the counter 1 through the second logic circuit 5. In this case, since the second logic circuit 5 receives the input signal of an "H" level at the other input terminal thereof, the second logic circuit outputs from its output terminal an output signal of an "H" level which is the same signal state as the input signal irrespective of the levels "H" and "L" of the input signal inputted into the one input terminal thereof. That is, the input signal is outputted from the output terminal as it is without being delayed.

If the input signal inputted into the output delay circuit 10 changes to an "L" level which is the second signal state, the input signal inputted into the other input terminal of the first logic circuit 4 also changes to an "L" level. Thus, the clocks inputted into the one input terminal of the first logic circuit is outputted from the output terminal thereof as it is and applied to the one input terminal of the second logic circuit 5. Further, when the input signal is at an "L" level, a value of an "H" level is outputted from the coincidence output terminal CO of the comparator 2 and applied to the second inverter 8, which in turn outputs an inverted level "L". Thus, since the second logic circuit 5 receives at the other input terminal thereof the inverted input level "L" from the second inverter 8, the second logic circuit outputs the clocks inputted into the one input terminal thereof as it is from the output terminal thereof and applies to the CK terminal of the counter 1, so that the counter 1 starts counting operation of the inputted clocks. Thus, the counter outputs an accumulated count number from the Q terminal thereof to the A terminal of the comparator 2.

The third logic circuit 6 outputs a value of an "H" level representing the first signal state as the output signal irrespective of the levels "H" and "L" of the input signal inputted into the other input terminal thereof while the comparator 2 outputs a value of an "H" level from the coincidence output terminal CO thereof to the one input terminal of the third logic circuit. In other words, even when the input signal changes from the first signal state to the second signal state, the output signal is kept at the first signal state.

The counter 1 continues the counting operation of the clocks in this manner, and when the accumulated count number inputted into the A terminal of the comparator 2 coincides with the predetermined count number inputted into the B terminal of the comparator 2, the comparator 2 outputs a value of an "L" level representing the coincidence from the coincidence output terminal CO thereof since the A side signal coincides with the B side signal. Thus, the second logic circuit 5 receives at the other input terminal thereof the inverted level "H" from the second inverter 8. As a consequence, the output value from the output terminal of the second logic circuit 5, that is, the input value to the CK terminal of the counter 1 becomes an "H" level irrespective of the input levels "H" and "L" applied to the one input terminal of the second logic circuit 5, whereby the counter 1 stops the counting operation thereof.

If the counting operation of the counter 1 is stopped in this manner, even when the input signal inputted into the output delay circuit 10 changes to an "L" level representing the second signal state, the output value from the coincidence output terminal Co of the comparator 2 does not change from the "L" level. Thus, the value of an "L" level is kept to be inputted into the one input terminal of the third logic circuit 6. Since the value of an "L" level representing the second signal state is also applied to the other input terminal of the third logic circuit 6, the third logic circuit 6 receives the value of an "L" level at both the input terminals thereof. Accordingly, the third logic circuit 6 outputs from its output terminal an output signal of an "L" level representing the same signal state as the input signal. In other words, the input signal is outputted as it is from the output terminal as the output signal without being delayed.

Thereafter, if the input signal inputted into the output delay circuit 10 changes to an "H" level representing the first signal state, the third logic circuit 6 receives the value of an "H" level at the one input terminal thereof. Thus, the third logic circuit outputs a value of an "H" level from the output terminal thereof as the output signal irrespective of the input levels "H" and "L" from the one input terminal. That is, the input signal is outputted as it is from the output terminal as the output signal without being delayed.

In this case, the counter 1 is supplied at the R terminal thereof with an inverted level "L" from the first inverter 7, so that the counter resets its count value having been accumulated heretofore and repeats the aforesaid operation.

According to such an output delay circuit 10, the counter 1 is reset in response to the input signal of the first signal state and counts the clocks inputted thereto while the input signal is in the second signal state. The comparator 2 compares the accumulated count value from the counter with the predetermined clock number set in advance. The third logic circuit 6 outputs the output signal having a signal state same as the first signal state when the accumulated count number is less than the predetermined clock number, while outputs the output signal having a signal state same as the second signal state when the accumulated count number becomes equal to the predetermined clock number. Thus, the predetermined number of the clocks have been inputted into the output delay circuit until the output signal having a signal state same as the second signal state is outputted after the input signal of the second signal state was inputted into the output delay circuit. In other words, the input signal is outputted as the output signal upon the lapse of a delay time corresponding to the predetermined clock number. Accordingly, the input signal can be outputted as the output signal upon the lapse of a desired delay time after the reception of the input signal by suitably setting the aforesaid predetermined clock number.

The control signal serving as the write signal is inputted into the storage device Me in a state that another control signal such as a CS signal for designating an access destination, for example, which was outputted simultaneously with the control signal and directly inputted into the storage device Me without passing through the output delay circuit, has designated an access destination during the delay time of the input signal. Accordingly, it is prevented that data is written at a different access destination upon writing into the storage device.

Although, in the embodiment, the input signal is the control signal outputted from the microprocessor Mi for controlling the accessing of the output signal to the storage device Me, the present invention is not limited thereto and another input signal other than such a control signal may be used.

Further, although, in the embodiment, the input signal serving as the control signal is the write signal, the present invention is not limited thereto and the input signal may be a read signal for controlling the reading operation from the storage device Me. In this case, it is prevented that data is read from a different access destination upon reading from the storage device.

The present invention can attain the following advantage even if the input signal is neither the write signal nor the read signal. That is, in the case where the storage device Me is required to have a condition for receiving a control signal in order for the microprocessor Mi to control the access to the storage device Me by the control signal, another control signal for preparing the condition is outputted simultaneously with the control signal and directly inputted into the storage device Me without passing through the delay circuit 10. Thus, the condition of the storage device is prepared by the another control signal during the delay time of the control signal passing through the output delay circuit, so that the control signal passed through the output delay circuit 10 is inputted into the storage device whose condition has been prepared, thereby performing the access control to the storage device Me.

Although, in the embodiment, the first signal state is an "H" level and the second signal state is an "L" level, the present invention is not limited thereto and the present invention can attain the same technical advantage even in a case where the first signal state is an "L" level and the second signal state is an "H" level.

Although, in the embodiment, the signal state representing the non-enable state is an "H" level and the signal state representing the enable state is an "L" level, the present invention is not limited thereto and the present invention can attain the same technical advantage even in a case where the signal state representing the non-enable state is an "L" level and the signal state representing the enable state is an "H" level.

Although, in the embodiment, the counter counts the clocks at every rising thereof, the present invention is not limited thereto and the present invention can attain the same technical advantage even if the counter counts the clocks at every falling thereof.

Although, in the embodiment, the output signal having a signal state same as the first signal state is outputted when the accumulated count number is equal to the predetermined clock number, the present invention is not limited thereto. For example, in a case where the counter is arranged to continue the counting operation of the input clocks until being reset even if the accumulated clock number exceeds the predetermined clock number, the present invention may be arranged to output the output signal having a signal state same as the first signal state when the accumulated clock number exceeds the predetermined clock number.

As described above, according to the present invention, the clock counting means is reset in response to the input signal of the first signal state and continues to count the input clocks thereby to obtain an accumulated clock number while the input signal of the second signal state is inputted, the comparing means compares the accumulated count number with the predetermined clock number set in advance, and the output portion outputs the output signal having a signal state same as the first signal state of the input signal when the accumulated number of the input clocks is less than the predetermined clock number, while outputs the output signal having a signal state same as the second signal state of the input signal when the accumulated number of the input clocks is not less than the predetermined clock number. Accordingly, the predetermined number of the clocks exists until the output signal having a signal state same as the second signal state is outputted after the input signal of the second signal state was inputted into the output delay circuit. In other words, the input signal is outputted as the output signal upon the lapse of a delay time corresponding to the predetermined clock number. Accordingly, the input signal can be outputted as the output signal upon the lapse of a desired delay time after the reception of the input signal by suitably setting the aforesaid predetermined clock number.

Further, in addition to the above, in the case where the storage device is required to have a condition for receiving a control signal in order for the microprocessor to control the access to the storage device by the control signal, another control signal for preparing the condition is outputted simultaneously with the control signal and directly inputted into the storage device without passing through the delay circuit. Thus, the condition of the storage device is prepared by the another control signal during the delay time of the control signal passing through the output delay circuit, so that the control signal passed through the output delay circuit is inputted into the storage device whose condition has been prepared thereby to perform the access control to the storage device.

Still further, the control signal serving as the write signal or the read signal is inputted into the storage device in a state that another control signal such as a CS signal for designating an access destination, for example, which was outputted simultaneously with the control signal and directly inputted into the storage device without passing through the output delay circuit, has designated an access destination during the delay time of the input signal. Accordingly, it is prevented that data is written at a different access destination upon writing into the storage device or that the data is read from a different access destination upon reading from the storage device.

What is claimed is:

1. An output delay circuit comprising:
   a counter to which an input signal having a first input state and a second input state, and input clock pulses are inputted, said counter being reset when the input signal is inputted in said first input state, and counting the input clock pulses while the input signal in said second input state is inputted thereto;
   a comparator connected to said counter so as to compare an accumulated number of the input clock pulses having been counted by said counter with a predetermined clock number set in advance and externally inputted to said comparator; and
   outputting means connected to said comparator, said outputting means outputting an output signal in the same state as the first input state when it is determined by said comparator that the accumulated number of the input clock pulses is less than the predetermined clock number, while outputting an output signal in the same state same as the second input state when it is determined by said comparator that the accumulated number of the input clock pulses is not less than the predetermined clock number.

2. The output delay circuit according to claim 1, wherein the output delay circuit is connected between a microprocessor and a storage device, the microprocessor outputting the input signal so as to control access operation to the storage device to which the output signal is inputted.

3. The output delay circuit according to claim 2, wherein the input signal is one of a write signal for controlling writing operation to the storage device and a read signal for controlling reading operation from the storage device.

4. The output delay circuit according to claim 1, wherein said outputting means comprises a logic circuit to which a comparative result of said comparator and the input signal are inputted.

5. The output delay circuit according to claim 1, further comprising a latch connected to said comparator so as to set the predetermined clock number and output the predetermined clock number to said comparator.

6. The output delay circuit according to claim 1, wherein said comparator outputs a signal for stopping a counting operation of said counter when the accumulated number of the input clocks and the predetermined clock number coincide with each other.

7. A binary, output delay circuit comprising:
   a counter which is reset during input of an input signal of a first signal state thereto and counts input clock pulses while the input signal of a second signal state is inputted thereto;
   a comparator connected to said counter and to a source of predetermined clock numbers for comparing an accumulated number of the input clock pulses having been counted by said counter with the predetermined clock number; and
   outputting means for producing an output signal having a signal state which is the same as the first signal state of the input signal when it is determined by said comparator that the accumulated number of the input clock pulses is less than the predetermined clock number, and for producing an output signal having a signal state which is the same as the second signal state of the input signal when it is determined by said comparator that the accumulated number of the input clock pulses is not less than the predetermined clock number.

8. The output delay circuit according to claim 7, wherein the input signal is a control signal outputted from a microprocessor for controlling access operation to a storage device to which the output signal is inputted.

9. The output delay circuit according to claim 8, wherein the control signal is one of a write signal for controlling writing operation to the storage device and a read signal for controlling reading operation from the storage device.

* * * * *